(12) United States Patent
Nishita et al.

(10) Patent No.: US 7,304,002 B2
(45) Date of Patent: Dec. 4, 2007

(54) METHOD OF OXIDIZING MEMBER TO BE TREATED

(75) Inventors: Tatsuo Nishita, Tokyo-To (JP);
Tsukasa Yonekawa, Tokyo-To (JP);
Keisuke Suzuki, Tokyo-To (JP); Toru Sato, Tokyo-To (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 10/519,451

(22) PCT Filed: Jul. 7, 2003

(86) PCT No.: PCT/JP03/08609

§ 371 (c)(1),
(2), (4) Date: Sep. 29, 2005

(87) PCT Pub. No.: WO2004/006322

PCT Pub. Date: Jan. 15, 2004

(65) Prior Publication Data

US 2006/0094248 A1 May 4, 2006

(30) Foreign Application Priority Data

Jul. 5, 2002 (JP) .............................. 2002-197671

(51) Int. Cl.
*H01L 21/469* (2006.01)
*H01L 21/31* (2006.01)
(52) U.S. Cl. ...................... 438/758; 438/770; 438/774; 438/762; 438/765; 438/769; 257/E21.285; 257/E21.283; 257/E21.282
(58) Field of Classification Search ................ 438/758, 438/770, 774, 762, 765, 769; 257/E21.285, 257/E21.283, E21.282
See application file for complete search history.

(56) References Cited

U.S. PATENT DOCUMENTS

| 6,114,258 A | * | 9/2000 | Miner et al. ................. 438/787 |
| 2002/0014700 A1 | | 2/2002 | Tokai et al. |
| 2002/0127873 A1 | | 9/2002 | Sato et al. |

FOREIGN PATENT DOCUMENTS

| EP | 1 152 461 A2 | * | 7/2001 |
| EP | 1 152 461 A2 | * | 11/2001 |

(Continued)

*Primary Examiner*—Michael Lebentritt
*Assistant Examiner*—Mohsen Ahmadi
(74) *Attorney, Agent, or Firm*—Smith, Gambrell & Russell LLP (57) ABSTRACT

A method for oxidation of an object to be processed is provided wherein an oxide film can provide favorable film quality and a laminate structure of nitride film and oxide film can be obtained by a thermal oxidation of a nitride film.

In a method for oxidation of a surface of an object to be processed in a single processing container 8 which can contain a plurality of objects to be processed, at least a nitride film is exposed on said surface, and said oxidation is performed by mainly using active hydroxyl/oxygen species in a vacuum atmosphere, setting a processing pressure to 133 Pa or below, and setting a processing temperature to 400° C. or above. Under these conditions, high interplanar uniformity is maintained and oxide films with favorable film quality are obtained by oxidizing nitride films on the surfaces of a plurality of objects to be processed.

4 Claims, 9 Drawing Sheets

FOREIGN PATENT DOCUMENTS

| | | | |
|---|---|---|---|
| EP | 1152461 | | 11/2001 |
| JP | 03-140453 | | 6/1991 |
| JP | 57-001232 | | 1/1992 |
| JP | 2001-274154 | * | 10/2001 |
| JP | 2002-176052 | * | 6/2002 |
| JP | 2002528892 | | 9/2002 |
| JP | 2002-353214 | | 12/2002 |
| WO | WO 00/24049 | * | 4/2000 |

* cited by examiner

METHOD OF OXIDIZING MEMBER TO BE TREATED

TECHNICAL FIELD

The present invention relates to a method for oxidation of objects to be processed, wherein an oxide film is formed by providing oxidation processing to a nitride film on the surface of an object to be processed such as a semiconductor wafer.

BACKGROUND OF THE INVENTION

To manufacture a semiconductor integrated circuit, various processing is generally applied to a semiconductor wafer comprising a silicon substrate or the like, such as film deposition, etching, oxidation, diffusion, modification, etc. Among the above sorts of processing, for example, representative oxidation processing includes oxidation of the surface of a polysilicon film or a single crystal film and oxidation of a metal film. Particularly, the oxidation processing is used in forming mainly a gate oxide film and an insulating film for a capacitor or a floating gate of a nonvolatile memory cell and the like The methods for the oxidation processing are categorized in terms of pressure as an atmospheric oxidation method performed inside a processing container with an atmosphere equivalent of a substantial atmospheric pressure and a vacuum oxidation method performed in a processing container with a vacuum atmosphere. In terms of classification of the gas used for oxidation, there are for example a wet oxidation method (e.g. the official gazette of Japanese Patent Application Publication No. Hei 3-140453/1991) in which hydrogen and oxygen are combusted by external combustion equipment to produce water vapor which is used to perform oxidation, and a dry oxidation method (e.g. official gazette of Japanese Patent Application Publication No. Sho 57-1232/1982) in which oxidation is performed without using water vapor whereas only ozone or oxygen is supplied into a processing container for example.

For the meantime, recent attention is drawn to an insulating film structure in which an oxide film, e.g. $SiO_2$ film, is laminated on the upper layer of a nitride film, as typified by SiN (a silicon nitride film) for example, due to the characteristics of outstanding heat resistance, insulating ability, etc.

Generally, an insulating film structure of this sort is developed by depositing $SiO_2$, by thermal CVD (Chemical Vapor Deposition), on a SiN film formed on the surface of a silicon substrate or the like

SUMMARY OF THE INVENTION

The $SiO_2$ film formed by thermal CVD as mentioned above, on the other hand, presents a problem in that the film quality is not high enough to fully meet today's requirement of the design specifications of semiconductor integrated circuits, because not only that the film thickness within the wafer plane is not very uniform, but also that the film structure is not very precise at a molecular or atomic level.

Given such situation, a method for forming a $SiO_2$ film with a precise structure by providing thermal oxidation directly to the surface of a SiN film has been disclosed in the official gazette of Japanese Patent Application Publication 2001-274154 for example, as substitute for the above method for film deposition of a $SiO_2$ film by CVD.

In the thermal oxidation method of the above publication, the surface of a SiN film is thermally oxidized by active species produced in a manner that oxygen gas and hydrogen gas are fed into a chamber and reacted with each other.

In this type of thermal oxidation to form a $SiO_2$ film, however, the processing conditions such as processing temperature, processing pressure and hydrogen gas concentration are very important to achieve favorable film quality and proper film thickness. The problem is that the processing conditions presented in the above publication are determined for a chamber for single wafer processing that processes a wafer one by one and cannot be applied straightforward to a batch-operating thermal processing apparatus that processes a plurality of wafers at once.

The present invention has been made in the light of the above problems to be solved effectively. The purpose of the present invention is to present a method for oxidation of objects to be processed, wherein a nitride film is thermally oxidized so as to provide an oxide film that is superior in film quality and a laminate structure of nitride film and oxide film. The present invention is an application of the invention disclosed in the Japanese Patent Application 2001-128350 previously applied by the present applicant.

The present invention is a method for oxidation of a surface of an object to be processed in a single processing container which can contain a plurality of objects to be processed, at least a nitride film being exposed on said surface, said method characterized by performing said oxidation wherein: active hydroxyl species and active oxygen species are mainly used in a vacuum atmosphere; a processing pressure is determined to be 133 Pa or below; and a processing temperature is determined to be 400° C. or above.

Consequently, high interplanar uniformity can be maintained and oxide films with favorable film quality can be obtained by oxidizing nitride films on the surfaces of a plurality of objects to be processed.

In this case, an oxidizing gas and a reducing gas can be fed into said processing container respectively by separate gas supply systems in order to produce said active oxygen species and said active hydroxyl species, according to another invention of the present application.

Moreover, said oxidizing gas can include one or more gases selected from a group of $O_2$, $N_2O$, NO and $NO_2$, said reducing gas can be $H_2$ gas, and $H_2$ concentration inside said processing container can be 40% or below, according to another invention of the present application.

Furthermore, a nitride film and silicon can be both exposed on said surface of said object to be processed, according to another invention of the present application.

Furthermore, said $H_2$ concentration can be within the range from 5 to 33%, according to another invention of the present application.

Furthermore, said processing temperature can be within the range from 800 to 1,000° C., according to another invention of the present application.

Furthermore, prior to said oxidation processing, said nitride film can be formed to have an extra thickness corresponding to a thickness of the surface of said nitride film to be oxidized, according to another invention of the present application.

Furthermore, said nitride film is preferably a silicon nitride film (SiN), according to another invention of the present application.

DETAILED DESCRIPTION OF THE INVENTION

An embodiment of a method for oxidation of objects to be processed according to the present invention will be hereinafter explained in detail with reference to the accompanying drawings.

Figure 1:
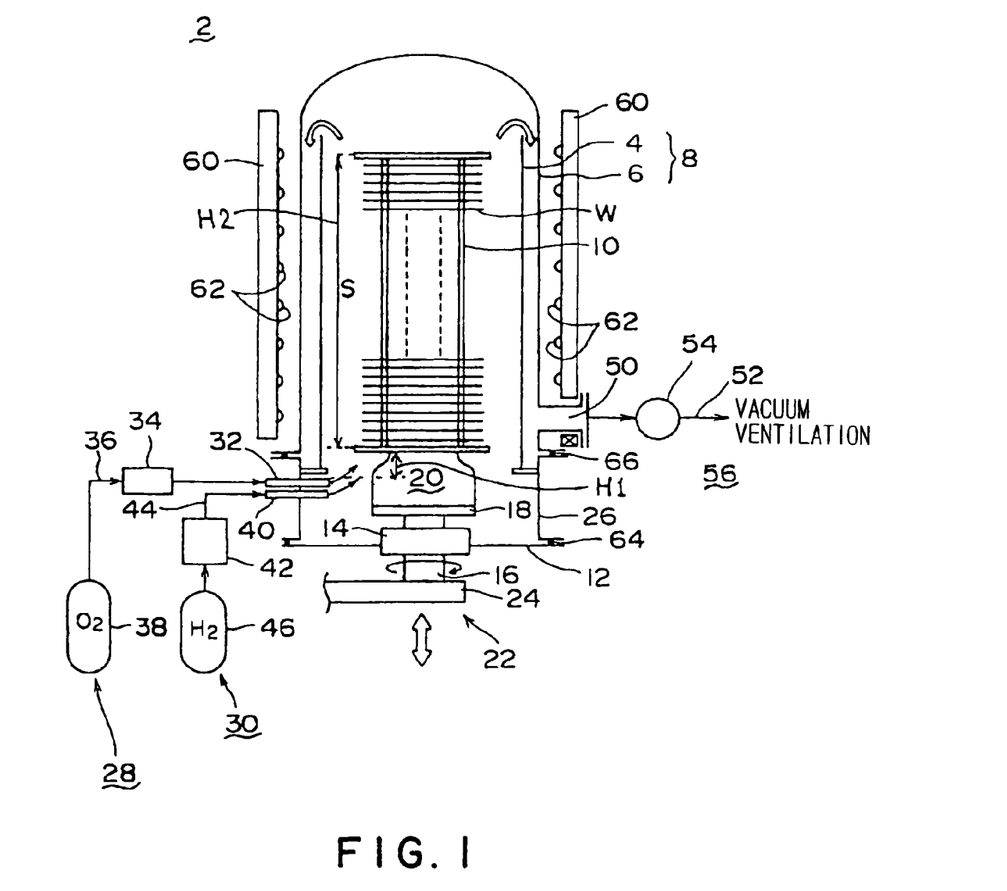
FIG. 1 is a block diagram showing an example of an oxidation apparatus for objects to be processed to embody an oxidation method according to the present invention.

FIG. 1 is a block diagram showing an example of an oxidation apparatus for objects to be processed to embody an oxidation method according to the present invention. The following is a description exemplifying a case wherein oxygen ($O_2$) is used as an oxidizing gas and hydrogen ($H_2$) as a reducing gas.

This oxidation apparatus 2 in FIG. 1 has a processing container 8 of a specific length which is vertical, made of quartz and has a double-tube structure comprising an inner tube 4 and an outer tube 6. A quartz wafer boat 10, as a support means to hold objects to be processed, is contained in a processing space S inside the inner tube 4. This wafer boat 10 holds semiconductor wafers W, as objects to be processed, in layers at specific pitches. Note that the pitches may be evenly spaced in some cases and may provide different pitches to position the wafers in other cases.

A cap 12 is provided to open/close the lower end of this processing container 8, and a rotating shaft 16 is provided piercing the cap 12 through a magnetic fluid seal 14. A rotary table 18 is provided on the upper end of this rotating shaft 16, and provided on this rotary table 18 is a heat insulating tube 20 on which the wafer boat 10 is mounted. The rotating shaft 16 is attached to an arm 24 of a vertically movable boat elevator 22 thus allowing the rotating shaft 16 a vertical move together with the cap 12, the wafer boat 10 and others, and the wafer boat 10 can be inserted/removed into/from the processing container 8 through the lower end of the processing container 8. Note that the wafer boat 10 may be fixed, without being rotated. A manifold 26, made of a stainless steel for example, is joined to the lower-end opening of the processing container 8. In order to feed a flow-rate controlled oxidizing gas and reducing gas into the processing container 8, an oxidizing gas supply system 28 and a reducing gas supply system 30 are separately provided to the manifold 26.

To be more precise, the oxidizing gas supply system 28 includes an oxidizing gas nozzle 32 piercing the manifold 26, and a gas supply line 36 is connected to this nozzle 32. A flow controller 34 such as a mass flow controller is inserted in the gas supply line 36 intermediately. To this gas supply line 36, an oxidizing gas source 38 is connected for retaining an oxidizing gas, such as oxygen in this embodiment.

Moreover, the reducing gas supply system 30 includes a reducing gas nozzle 40 piercing the manifold 26 in the same manner as explained above, and a gas supply line 44 is connected to this nozzle 40. A flow controller 42 such as a mass flow controller is inserted in the gas supply line 44 intermediately. To this gas supply line 44, a reducing gas source 46 is connected for retaining a reducing gas, such as hydrogen in this embodiment.

The gases supplied from the nozzle 32 and 40 respectively thus flow up through the wafer-accommodating region, i.e. the processing space S inside the inner tube 4, and back down from the ceiling part to flow through the clearance between the inner tube 4 and outer tube 6 and are then discharged. In addition, an exhaust vent 50 is provided in the bottom sidewall of the outer tube 6, and a vacuum vent system 56 provided by inserting a vacuum pump 54 in an exhaust line 52 is connected to this exhaust vent 50, thereby evacuating the air inside the processing container 8. At this point, a distance H1 between the wafer-accommodating region as the processing space S and each gas feed location, more specifically the distance H1 between the lower-end portion of the wafer-accommodating region i.e. the lower-end portion of the wafer boat 10 and the gas outlet at the end of each of the nozzles 32 and 40, is spaced apart by a predetermined distance. The purposes of providing the distance H1 in this way is firstly to preheat the gasses by heat radiation from the processing container 8 which is heated by a heater 62 and provides a hot-wall condition while each gas flows upwardly by the distance H1, and secondly to fully mix both the gases while both of the gases flow upwardly through the distance H1.

The distance H1 therefore is determined to be 100 mm or above, preferably 300 mm or above, for example which allow the fed oxidizing gas and reducing gas to be fully mixed without causing an adverse effect on the temperature distribution in the wafer-accommodating region (processing space S). Besides, a heat-insulating layer 60 is provided around the outer circumference of the processing container 8, and the heater 62 is provided on the inner side of this heat-insulating layer 60 as a heating means, thereby heating wafers W located inside the heat-insulating layer 60 to a predetermined temperature.

Given that the wafer boat 10 holds approximately 150 wafers W (approximately 130 product wafers and 20 dummy wafers or the like) and the diameter of the wafers W subjected to film deposition is 8 inches for example, the size of the processing container 8 as a whole is such that the inner tube 4 is approximately 260 to 270 mm in diameter, the outer tube 6 is approximately 275 to 285 mm in diameter and the processing container 8 is approximately 1,280 mm in height.

In a case that the diameter of the wafers W is 12 inches, the number of the wafers held by the wafer boat 10 may be approximately 25 to 50. In this instance, the inner tube 4 is approximately 380 to 420 mm in diameter, the outer tube 6 is approximately 440 to 500 mm in diameter and the processing container 8 is approximately 800 mm in height. The height H2 of the wafer boat 10 depends on the number of the wafers and is within the range from approximately 200 to 1,000 mm. Note that these numerical values are presented by way of example only.

As shown in FIG. 1, a sealing member 64 such as an O-ring seals the gap between the cap 12 and the manifold 26, and a sealing member 66 such as an O-ring seals the gap between the manifold 26 and the lower-end portion of the outer tube 6.

In the next place, an oxidation method according to the present invention implemented by using the oxidation apparatus with the aforementioned structure will be explained.

Firstly a number of unprocessed semiconductor wafers W comprising silicon substrates for example are held on the wafer boat 10 in layers at specific pitches. The wafer boat 10 with the wafers W thereon then is inserted into the processing container 8 from below by driving the boat elevator 22 upwardly, and the inside of the processing container 8 is sealed. The processing container 8 has been preheated inside, and nitride films subjected to oxidation treatment, such as silicon nitride films (SiN), have already been formed on the surfaces of the semiconductor wafers W respectively at least in the preceding process and exposing their surfaces. The nitride films and silicon surfaces may be exposed in a mixed manner in certain surface structures.

After the wafers W are inserted as described above, the supply voltage to the heater 62 is increased to heat the wafers W to a predetermined processing temperature, and the air inside the processing container 8 is evacuated by the vacuum vent system 56.

At the same instant, the oxidizing gas nozzle 32 of the oxidizing gas supply system 28 feeds oxygen into the processing container 8 at a controlled flow rate, and the reducing gas nozzle 40 of the reducing gas supply system 30 feeds hydrogen into the processing container 8 at a controlled flow rate.

The oxygen and the hydrogen separately fed into the processing container 8 in this way flow upwardly inside the processing container 8 whereas oxidizing the surfaces of the silicon nitride films of the wafers, or the silicon nitride films and silicon surfaces in a case that the silicon nitride film surfaces and the silicon surfaces are exposed, due to the hydrogen undergoing a combustion reaction near the wafers W. At this point, the oxidation processing is performed under the conditions that the temperature of the wafers are 400° C. or above, e.g. within the range from 400 to 1,000° C., preferably within the range from 800 to 1,000° C. in consideration of the heat resistance etc. of the elements in the lower layers, and the pressure is 133 Pa (1 Torr) or below. The concentration of the hydrogen gas ($H_2$ concentration) is determined to be 40% or below with respect to the total amount of the supplied gas.

In this manner, the in-plane uniformity and the quality of the oxide film can both be significantly improved while a certain oxidation rate is maintained.

By separately feeding hydrogen and oxygen into the processing container 8 with an atmosphere of reduced pressure, it is considered that the hydrogen undergoes the following combustion reactions near the wafers W. Note that the active species of the chemical symbol is indicated by an asterisk * in the respective formula below.

By separately feeding $H_2$ and $O_2$ into the processing container 8 in this way, O* (active oxygen species), OH* (active hydroxyl species) and $H_2O$ (water vapor) are produced in the course of the combustion reaction of hydrogen, thereby oxidizing the surfaces of the wafers W. In this case, it is considered that the above active species O* and OH* highly contribute to the improvement of the film quality and the planar and interplanar uniformity of the film thickness. In other words, by performing the oxidation processing in a vacuum atmosphere with a processing pressure quite lower than that in a conventional oxidation method as mentioned above, the chemical reactions, as indicated above by a series of the reaction formulas, proceed slowly as the $H_2$ gas and $O_2$ gas flow upwardly inside the processing container 8, thus realizing the condition that the adequate amount of $H_2O$ is available for the wafers W at every height which are therefore subjected substantially uniformly to the oxidation reaction. As a result the interplanar uniformity of the film thickness can particularly be improved. In more specific terms, the processing pressure is determined to be 133 Pa or below which is quite lower than that in a conventional method as mentioned above, hence resulting in prolonging the lives of both the active species of oxygen and a hydroxyl group. Consequently, these active species flow upwardly through the height H2 of the processing space S without becoming very much extinct and contribute to the oxidation reaction, and thus the interplanar uniformity of the film thickness is improved.

Moreover, since $H_2$ gas and $O_2$ gas are supplied through the distance H1 from the lower-end portion of the processing space S in this case instead of being directly supplied to the processing space S, both the gases can be fully mixed while flowing up the length of the distance H1. Furthermore, since, while flowing up the length of the distance H1, both the gases are preheated by the heater 62 or by the heat of the processing container 8 which is heated by the heater 62 and provides a hot-wall condition, activation of both the gases can be promoted.

Hereinafter explained is the progress of a silicon oxide film ($SiO_2$) formation by thermally oxidizing the silicon surface and the silicon nitride film (SiN) formed on the surface of a semiconductor wafer W.

Figure 2:
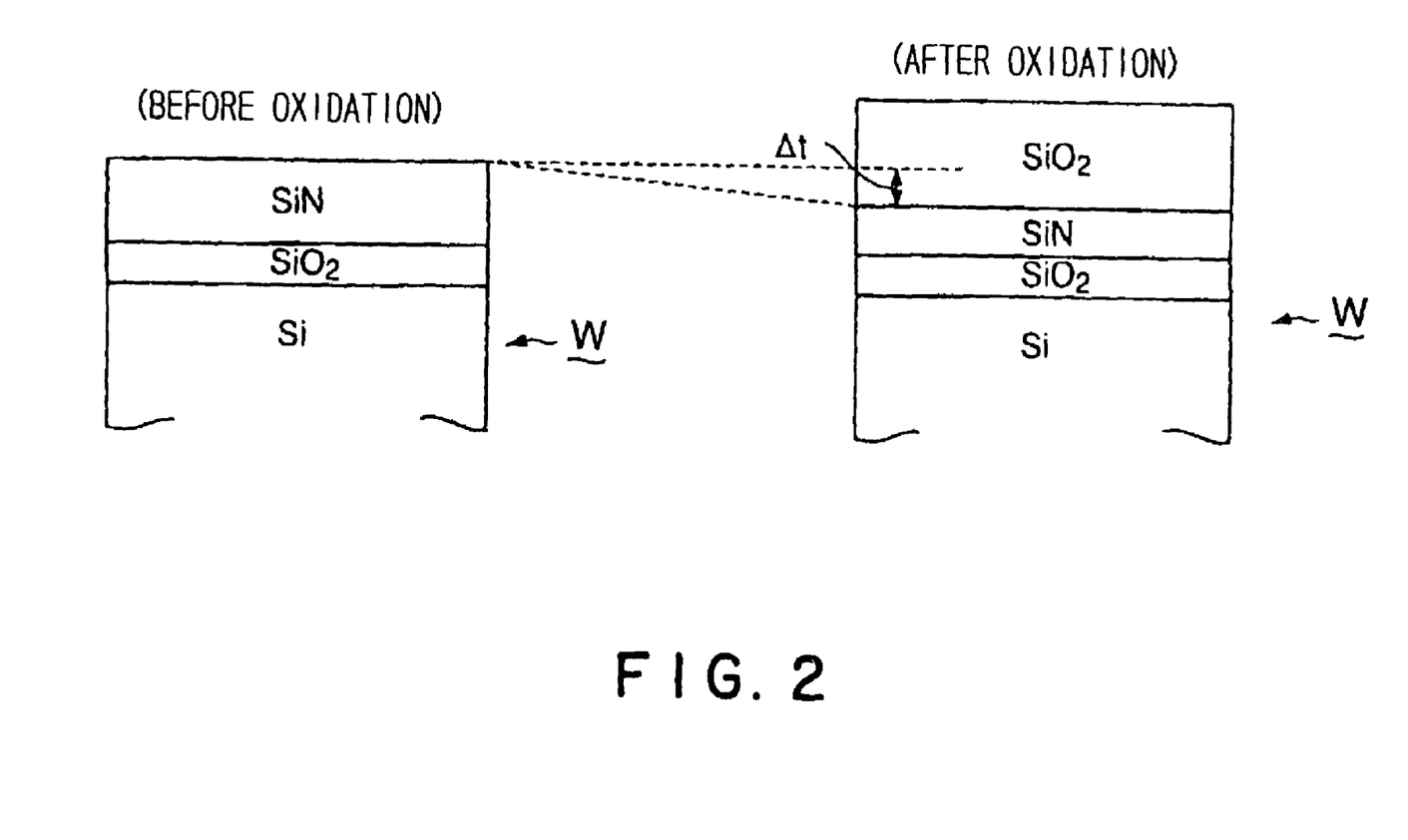
FIG. 2 is a diagram showing a state that the entire surface of a semiconductor wafer is covered with a silicon nitride film.
Figure 3:
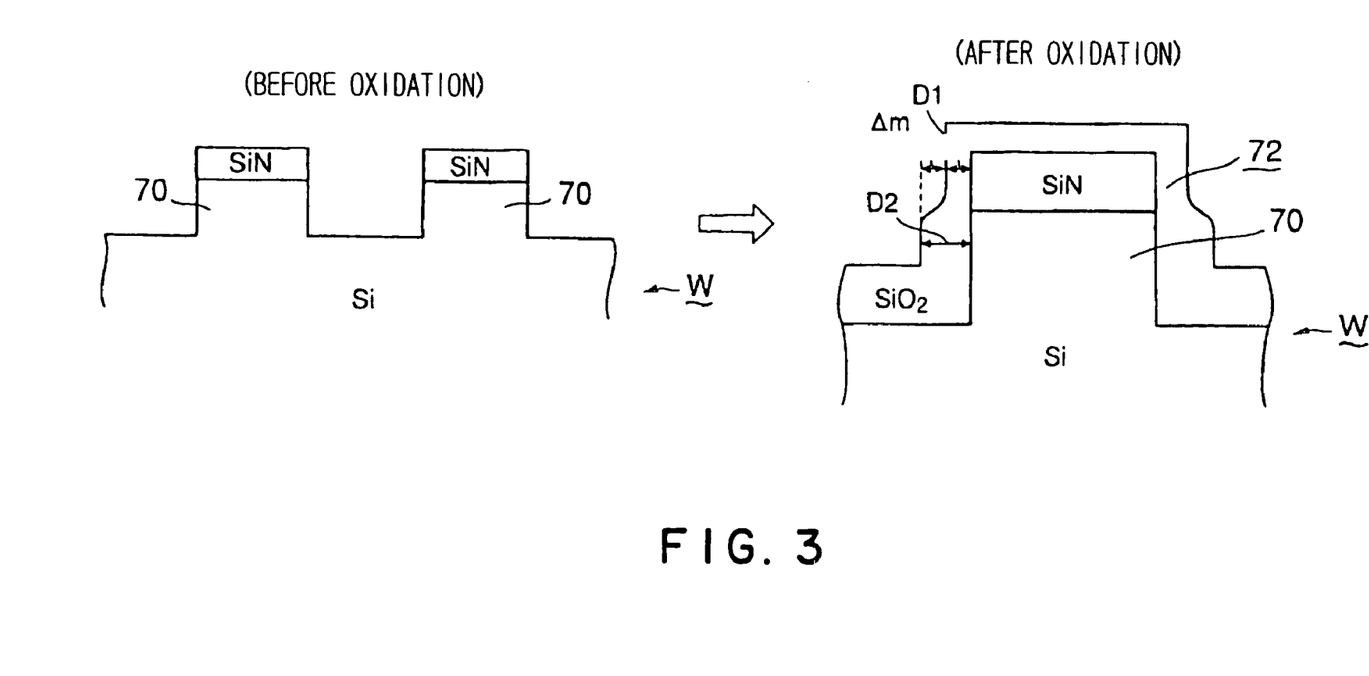
FIG. 3 is a diagram showing a state that a silicon nitride film and silicon are both exposed on the surface of a semiconductor wafer.

FIG. 2 shows a state that the entire surface of a semiconductor wafer is covered with a silicon nitride film, and FIG. 3 shows a state that a silicon nitride film and silicon are both exposed on the surface of a semiconductor wafer. The embodiment in FIG. 2 shows for example a phase of the manufacturing process for a laminate structure of $SiO_2$—SiN—$SiO_2$ (three-layer structure of ONO) used for an insulating film for a floating gate of a nonvolatile memory cell. The embodiment in FIG. 3 shows a plurality of stack-like (convex) silicon-layer projections 70 on the surface of a wafer, and silicon nitride film (SiN) is formed on the upper surfaces of the projections 70 to provide a pattern to form shallow trenches for example.

By using active hydroxyl species and active oxygen species mainly for oxidation processing as in the present invention, far higher oxidation power is exhibited than in the conventional dry oxidation method using $O_2$ or wet oxidation method using $H_2O$. In this way, the oxidation proceeds by oxygen (O) replacing nitrogen which is removed from the silicon nitride film (SiN) to form a $SiO_2$ film. In this case, when silicon is exposed on the wafer surface, the silicon is also oxidized as a matter of course to form a $SiO_2$ film.

FIG. 2 shows the progress of a silicon oxide film ($SiO_2$) formation by oxidation of the surface of a silicon nitride film. The silicon oxide film is formed in FIG. 2 by oxidizing the silicon nitride film by an amount equivalent to the thickness $\Delta t$. At this point, the whole thickness is increased after the oxidation because the density at a molecular level is lower in a silicon oxide film than in a silicon nitride film. The thickness $\Delta t$ of the silicon nitride film decreased by the oxidation processing depends as a matter of course on the oxidation time.

Figure 4:
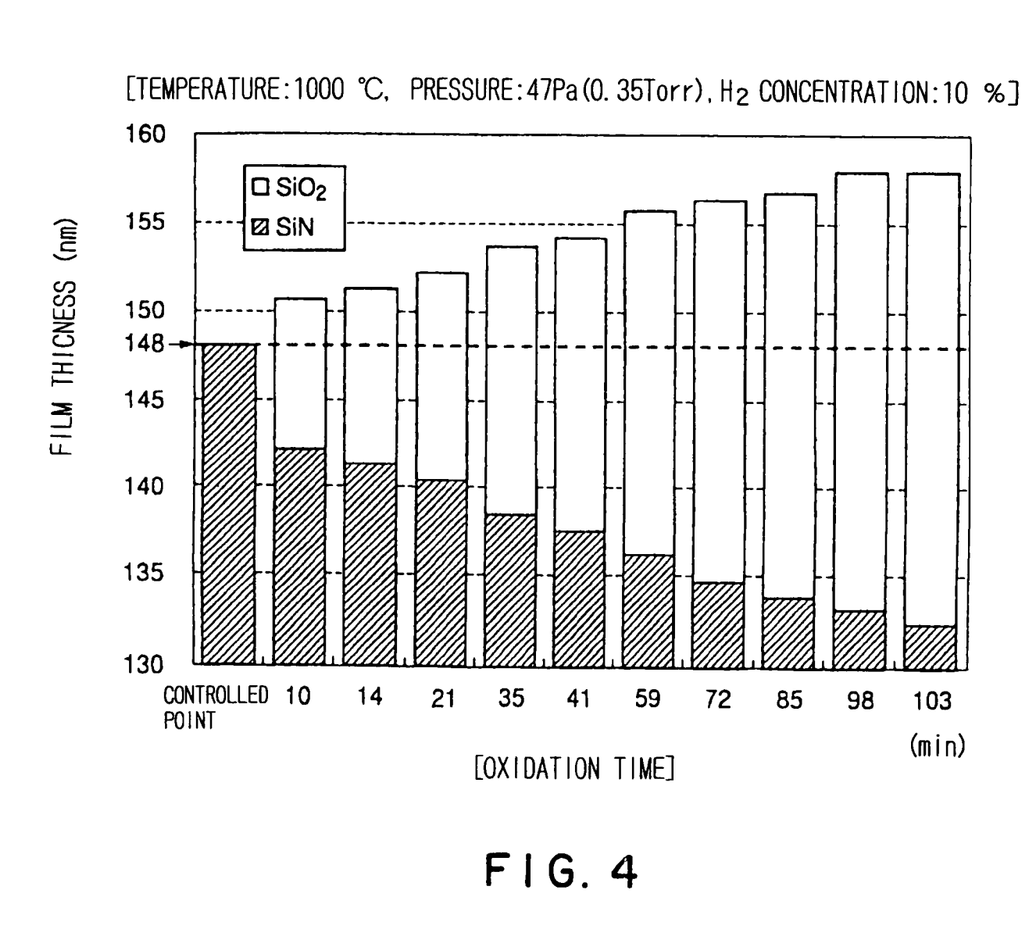
FIG. 4 is a graph indicating the thickness variation of a silicon nitride film and a silicon oxide film during thermal oxidation.

FIG. 4 is a graph indicating the thickness variation of a silicon nitride film and a silicon oxide film during thermal oxidation. A silicon nitride film of 148 nm in thickness is subjected to thermal oxidation up to 103 minutes according to the oxidation method of the present invention, and the variation of the film thickness of both of the films is indicated in this graph. This oxidation processing is performed under the condition that the temperature is 1,000° C., pressure 47 Pa, and $H_2$ concentration (the proportion of the supply amount of the $H_2$ gas to the total gas-supply amount) 10%. It is apparent from the graph that the thickness of the silicon nitride film becomes smaller as the thermal oxidation time increases and the oxidation of the silicon nitride film therefore progresses, and the thickness of the silicon oxide film produced by the thermal oxidation gradually increases instead. The oxidation rate in this case, needless to add, depends on the processing conditions.

Since the thickness of the silicon nitride film becomes smaller in this way as the oxidation of the surface of the silicon nitride film progresses, the silicon nitride film should be formed to have the extra thickness $\Delta t$ during manufacturing, as in a case shown in FIG. 2 wherein the three-layer structure of ONO is formed, in addition to the targeted thickness of the silicon nitride film which should be maintained as a finalized integrated circuit element. That is, the silicon nitride film prior to oxidation in FIG. 2 should be formed in advance to have a thickness increased from the design thickness by the thickness $\Delta t$ which is subjected to the thermal oxidation.

<$H_2$ Concentration Dependence>

The dependence of the $H_2$ concentration was evaluated. The following explains the evaluation result.

In a case that the silicon nitride film and silicon are exposed on the surface such as in a so-called stack structure as shown back in FIG. 3, a silicon oxide film 72 is formed on each of the surfaces of the silicon nitride film and the silicon layer. At this point, the thickness D1 of the silicon oxide film formed on the silicon nitride film and the thickness D2 of the silicon oxide film formed on the silicon layer could differ depending on the processing conditions.

Figure 5:
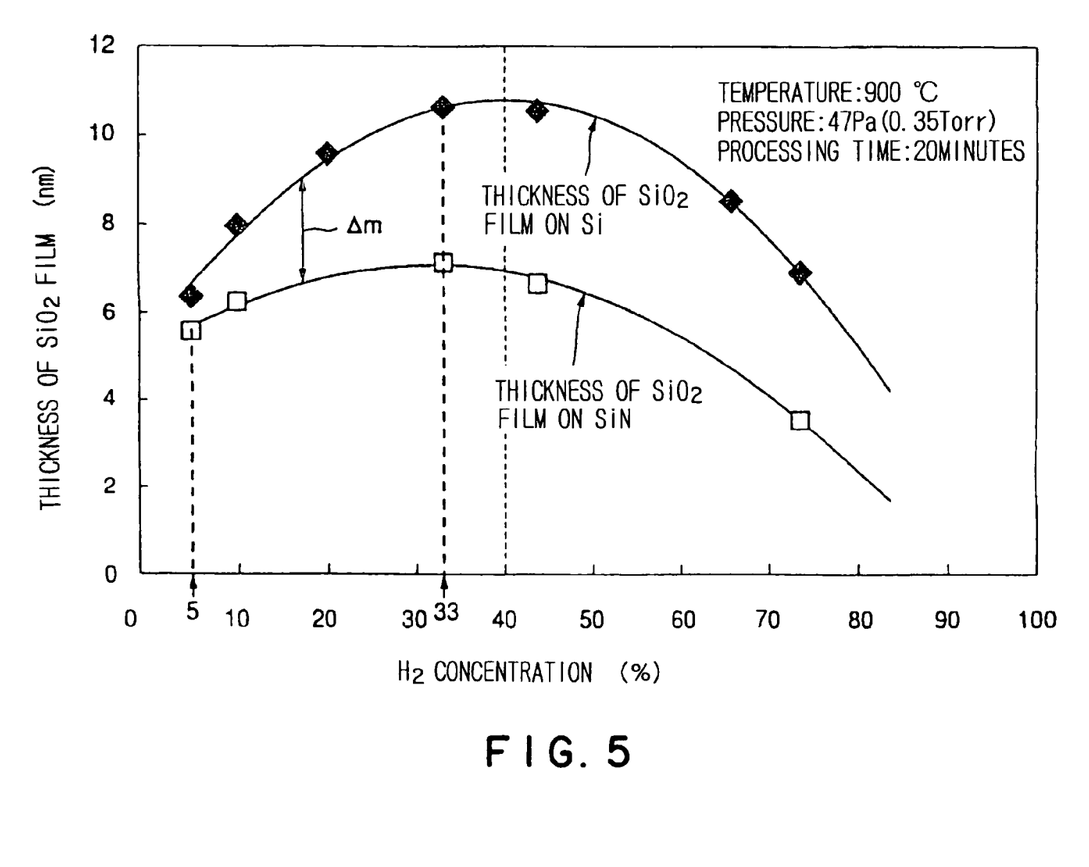
FIG. 5 is a graph showing the film thickness dependence of $SiO_2$ films on Si and $SiO_2$ films on SiN corresponding to $H_2$ concentration changes.
Figure 6:
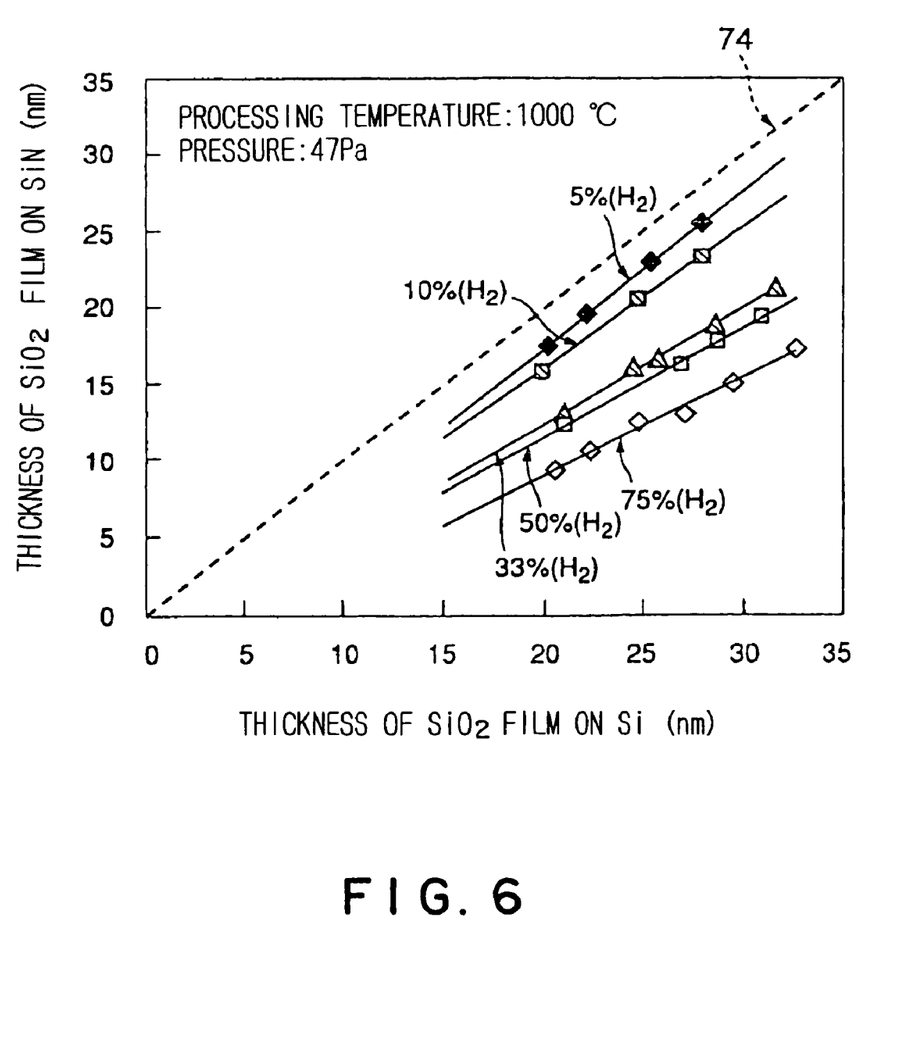
FIG. 6 is a graph indicating the film thickness dependence of $SiO_2$ films on Si and $SiO_2$ films on SiN corresponding to $H_2$ concentration changes.

FIGS. 5 and 6 are graphs showing film thickness dependence of the $SiO_2$ film on either Si and SiN corresponding to $H_2$ concentration changes, wherein FIG. 5 plots $H_2$ concentration on the horizontal axis and the thickness of the $SiO_2$ film on the vertical axis and FIG. 6 plots the thickness of the $SiO_2$ film on Si on the horizontal axis and the thickness of the $SiO_2$ film on SiN on the vertical axis. The processing conditions in the case shown in FIG. 5 are that the temperature is 900° C., the pressure 47 Pa, and the processing time 20 minutes. The processing conditions in the case shown in FIG. 6 are that the processing temperature is 1,000° C. and the pressure 47 Pa.

Firstly, when the $H_2$ concentration is gradually increased from approximately 5 to 80% as shown in FIG. 5, the film thickness (film deposition rate) of the $SiO_2$ films on either Si and SiN gradually increases to reach a peak at the $H_2$ concentration of approximately 40%, then decreases. This thus proves that, in consideration of the film deposition rate of the $SiO_2$ film, the preferable $H_2$ concentration (the concentration of $H_2$ gas) is determined to be 40% or below in consideration of less $H_2$ gas consumption.

In addition, the difference $\Delta m$ (refer to FIGS. 3 and 5) between the thickness of the $SiO_2$ film on SiN and the thickness of the $SiO_2$ film on Si is smaller when the $H_2$ concentration is lower, and greater when the $H_2$ concentration is higher. This is also confirmed by FIG. 6 in which, as the $H_2$ concentration becomes higher, the lines showing the ratio of both the films are distanced further from a dotted line 74 which is at an angle of 45 degrees and represents the ratio of 1:1.

With respect to the processing conditions for obtaining a silicon oxide film that is denser and superior in quality in this instance, preferably the oxidizing ability which is capable of oxidizing a silicon nitride film is relatively stronger compared to oxidizing silicon. In other words, because the film thickness difference $\Delta m$ is desired to be smaller, it is learned that the preferable $H_2$ concentration which makes the difference $\Delta m$ smaller is within the range from 5 to 33%, more preferably 5 to 10%, which is quite excellent. By reducing the $H_2$ concentration in this way, $SiO_2$ film which is formed by the active species and is dense and superior in quality can occupy a greater portion.

Moreover, when a $SiO_2$ film is formed on the surface of a stack structure as shown in FIG. 3 as previously described, the thickness D1 and the thickness D2 need to be equal as closely as possible to prevent unevenness on this part, and in this connection it is as well confirmed that the reduced $H_2$ concentration is required, preferably within the range from 5 to 33%, more preferably 5 to 10%.

<Processing Pressure Dependence>

The dependence of the thickness of an oxide film formed on a silicon nitride film on processing pressure was examined. The following explains the evaluation result of the examination.

Figure 7:
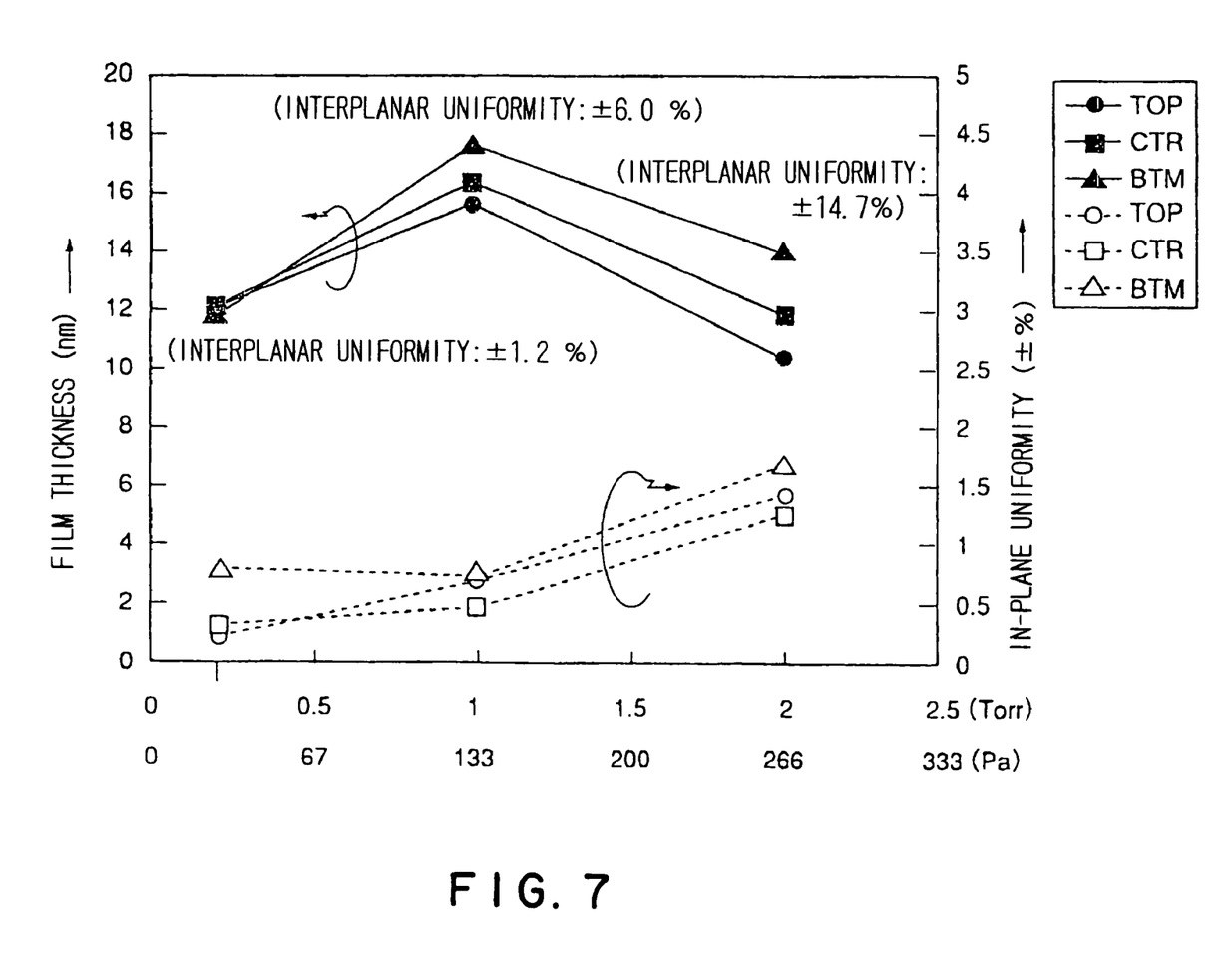
FIG. 7 is a graph indicating the film thickness of oxide films formed respectively on silicon nitride films and the dependence of the in-plane uniformity on processing pressure.
Figure 8:
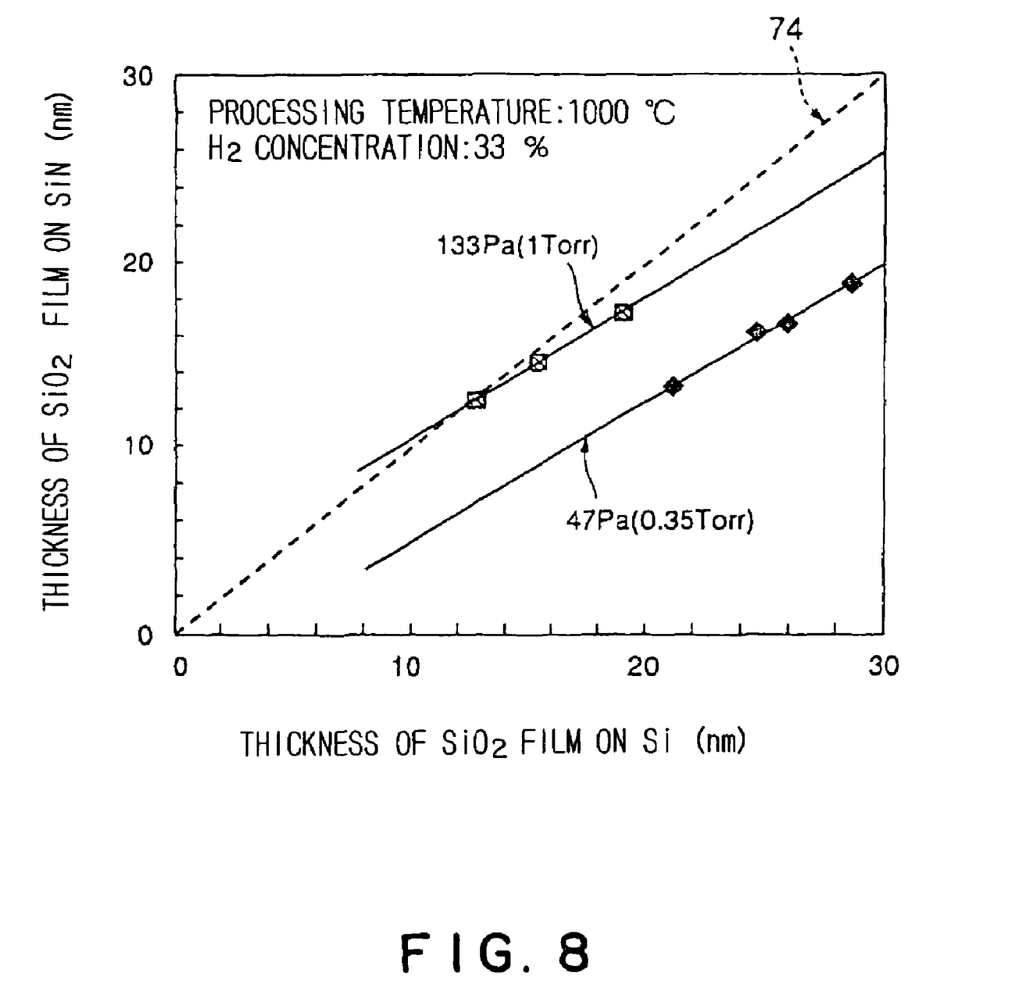
FIG. 8 is a graph indicating the pressure dependence of the film thickness of $SiO_2$ films formed on Si and $SiO_2$ films formed on SiN.

FIG. 7 is a graph indicating the film thickness of oxide films formed respectively on silicon nitride films and the dependence of the in-plane uniformity on processing pressure, and FIG. 8 is a graph indicating the pressure dependence of the film thickness of $SiO_2$ films formed on Si and $SiO_2$ films formed on SiN. Note that the interplanar uniformity is also present in the graph indicating the film thickness shown in FIG. 7. In this graph, TOP stands for a wafer located at the upper position on the wafer boat, CTR for a wafer located at the middle position on the wafer boat and BTM for a wafer located at the bottom position on the wafer boat. The processing conditions in FIG. 7 are such that the processing temperature is 900° C., the $H_2$ gas flow rate 0.6 liter/min, the $O_2$ gas flow rate 1.2 liter/min and the processing time 60 minutes. In FIG. 8, the processing temperature is 1,000° C. and the $H_2$ concentration is 33%.

It is apparent from the graph shown in FIG. 7 that the more the processing pressure decreases, the more improved the in-plane uniformity and interplanar uniformity of film thickness both become. Moreover, it has been learned that the processing pressure requires to be set at 133 Pa (1 Torr) or below to meet the requirement as desired in the future oxidation processes, i.e. the in-plane uniformity of approximately plus/minus 0.8% and the interplanar uniformity of approximately plus/minus 6%.

Furthermore, the thickness of the $SiO_2$ film on Si and the $SiO_2$ film on SiN were compared under the processing pressure of 133 Pa and 47 Pa. Apparently, as shown in FIG. 8, the ratio of the films is close to 1:1 (a broken line 74) around the processing pressure of 133 Pa, and the thickness of the $SiO_2$ film on Si is relatively reduced as the processing pressure decreases from 133 Pa. Consequently, it is learned that, under the processing pressure of 133 Pa or below, high interplanar uniformity and in-plane uniformity of the film thickness can be maintained in batch processing as described above, and also an appropriate ratio of the film thickness of the $SiO_2$ film formed on Si and the $SiO_2$ film formed on SiN can be chosen as necessary.

<Processing Temperature Dependence>

The dependence of the thickness of an oxide film formed on a silicon nitride film on processing temperature was examined. The following explains the evaluation result of the examination.

Figure 9:
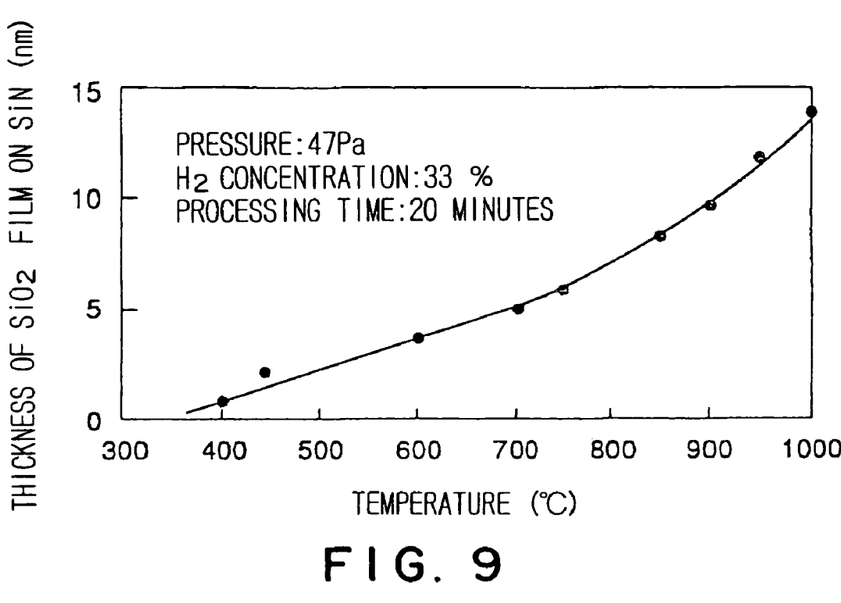
FIG. 9 is a graph indicating the relationship between the processing temperature and the thickness of silicon oxide films formed respectively on silicon nitride films.
Figure 10:
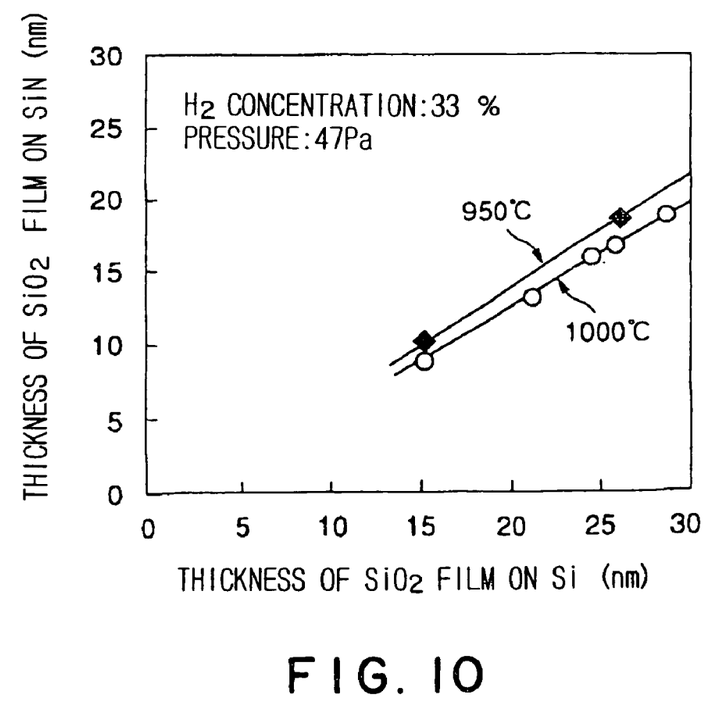
FIG. 10 is a graph indicating the film thickness dependence of $SiO_2$ films on Si and $SiO_2$ films on SiN corresponding to the temperature variation.

FIG. 9 is a graph indicating the relationship between the processing temperature and the thickness of silicon oxide films formed respectively on silicon nitride films, and FIG. 10 is a graph indicating the film thickness dependence of $SiO_2$ films on Si and $SiO_2$ films on SiN corresponding to the temperature variation.

The processing conditions in the case shown in FIG. 9 are such that the pressure is 47 Pa, $H_2$ concentration 33% and the processing time 20 minutes. As for FIG. 10, the pressure is 47 Pa and $H_2$ concentration is 33% while two temperatures, 9500 and 1,000° C., are given.

It is apparent from the graph shown in FIG. 9 that the $SiO_2$ film has a thickness of approximately 1 nm at the temperature of 400° C., and, as the temperature rises, the film thickness shows an increase appearing as a quadratic curve to reach the film thickness of 15 nm at 1,000° C. When the temperature is lower than 1,000° C., the oxidation of silicon nitride films is almost impossible because the active species are not produced.

It is learned consequently that the processing temperature is required to be set within the range from 400 to 1,000° C. in order to form a silicon oxide film by thermally oxidizing the silicon nitride film by the active species. The preferable processing temperature setting particularly is within the range from 800 to 1,000° C. in view of the desired film deposition rate rather than the film thickness.

In particular it has been learned by comparison between the thickness of the $SiO_2$ films formed on Si and the $SiO_2$ films formed on SiN under the fixed processing temperature of 950° C. and 1,000° C. that the favorable results can be obtained as shown in FIG. 10 wherein thin films are formed providing thicker $SiO_2$ films on Si formed at the ratio of approximately 3:4 to 2:3. Also under the temperature of 750° C., 800° C. and 850° C. examinations were conducted in the same manner as explained in FIG. 10, and it has been confirmed that the same result was obtained.

Although the above embodiment was explained by exemplifying a case wherein $O_2$ gas is used as an oxidizing gas and $H_2$ gas is used as a reducing gas, the oxidizing gas may be one or more gases selected from a group of $O_2$, $N_2O$, NO and $NO_2$.

In this case again, active oxygen species and active hydroxyl species produced in the course of combustion of the reducing gas mainly contribute to the oxidation reaction on wafer surfaces, as previously described. When the above gases, besides $O_2$ gas and $H_2$ gas, are used, the processing conditions such as the temperature of the wafers and processing pressure may also be set in nearly the same way as those previously described for the case in which $O_2$ gas and $H_2$ gas are used.

Moreover, the object to be processed in the method according to the present invention is not limited to a semiconductor wafer but may include a LCD substrate, glass substrate, etc.

According to the present invention as a method for oxidation of objects to be processed, the following superior operational advantages can be achieved as explained above.

Oxide films which maintain excellent uniformity of film thickness and film quality can be obtained in oxidation of nitride films on the surfaces of a plurality of objects to be processed.

The invention claimed is:

1. A method for oxidation of a surface of an object to be processed in a single processing container which can contain a plurality of objects to be processed, said method characterized by performing said oxidation wherein:
    an oxidizing gas and $H_2$ gas are fed into said processing container, respectively, by separate gas feed locations, a distance between a region for accommodating the object to be processed in the processing container and each of said gas feed locations being 100 mm or more;
    active hydroxyl species and active oxygen species are mainly used in a vacuum atmosphere;
    a processing pressure is determined to be 133 Pa or below;
    a processing temperature is determined to be 400° C. or above; and
    $H_2$ concentration inside said processing container is within the range of from 5 to 33%;
    further wherein a plurality of stack-like silicon-layer projections are formed on a surface of said object to be processed, and a silicon nitride film is formed on upper surfaces of said projections.

2. A method for oxidation of an object to be processed according to claim 1, characterized in that: said oxidizing gas includes one or more gases selected from the group consisting of $O_2$, $N_2O$, NO and $NO_2$.

3. A method for oxidation of an object to be processed according to claim 1, characterized in that said processing temperature is within the range from 800 to 1,000° C.

4. A method for oxidation of an object to be processed according to claim 1, wherein said oxidation forms $SiO_2$ on said silicon nitride film of the object.

* * * * *